United States Patent
Guo et al.

(10) Patent No.: US 10,638,646 B2
(45) Date of Patent: Apr. 28, 2020

(54) POWER MODULE ASSEMBLY AND ASSEMBLING METHOD THEREOF

(71) Applicant: Delta Electronics (Shanghai) Co., Ltd., Shanghai (CN)

(72) Inventors: Wei Guo, Shanghai (CN); Peiai You, Shanghai (CN); Hao Sun, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/033,516

(22) Filed: Jul. 12, 2018

(65) Prior Publication Data
US 2019/0069438 A1 Feb. 28, 2019

(30) Foreign Application Priority Data
Aug. 23, 2017 (CN) .......................... 2017 1 0729631

(51) Int. Cl.
*H05K 7/20* (2006.01)
*H02M 7/00* (2006.01)
(Continued)

(52) U.S. Cl.
CPC ............ *H05K 7/209* (2013.01); *H02M 7/003* (2013.01); *H05K 1/0203* (2013.01); *H05K 1/184* (2013.01);
(Continued)

(58) Field of Classification Search
CPC ............... H05K 1/141; H05K 7/20436; H05K 7/20409; H05K 7/20418; H05K 5/0217;
(Continued)

(56) References Cited

U.S. PATENT DOCUMENTS 4,215,361 A * 7/1980 McCarthy ........... H01L 23/4093
165/80.3
4,261,005 A * 4/1981 McCarthy ........... H01L 23/4093
165/80.3
(Continued)

FOREIGN PATENT DOCUMENTS

CN 101923991 A 12/2010
CN 203242611 U 10/2013
(Continued)

*Primary Examiner* — Adam B Dravininkas
(74) *Attorney, Agent, or Firm* — Kirton McConkie; Evan R. Witt

(57) ABSTRACT

The present disclosure provides a power module assembly and an assembling method thereof. The power module assembly includes a housing, a circuit board, at least one resilient set, at least two power devices, and at least one fastening unit. The housing includes at least one heat-dissipation surface. The at least one resilient set is disposed between the housing and the circuit board and includes at least one resilient piece. Each resilient piece includes a base section and two pushing fingers, so as to form an M-word shape or a bird-wings shape. The fastening unit is disposed between the two power devices, connected to the base section of the resilient piece and configured to drive the base section of the resilient piece, so that the two pushing fingers of the resilient piece push against the two power devices respectively and the two power devices are attached to the heat-dissipation surface.

32 Claims, 11 Drawing Sheets

(51) Int. Cl.
*H05K 1/18* (2006.01)
*H05K 1/02* (2006.01)

(52) U.S. Cl.
CPC ......... *H05K 7/2049* (2013.01); *H05K 7/2089* (2013.01); *H05K 7/20436* (2013.01); *H05K 7/20927* (2013.01); *H05K 2201/10393* (2013.01); *H05K 2201/10409* (2013.01); *H05K 2201/10522* (2013.01); *H05K 2201/10757* (2013.01)

(58) Field of Classification Search
CPC ............... H05K 5/0221; H05K 7/1432; H05K 7/20854; H05K 7/20772; H05K 1/0203; H05K 7/2049; H05K 7/20336; H05K 7/1427; H05K 1/144; H05K 2201/2036; H05K 7/20318; H05K 5/0247; H05K 7/20927; H05K 7/209; H05K 5/306; H05K 1/184; H05K 1/203; H05K 7/2089; H05K 2201/10757; H05K 2201/10522; H05K 2201/10409; H05K 2201/10393
See application file for complete search history.

(56) References Cited

U.S. PATENT DOCUMENTS

| | | | | |
|---|---|---|---|---|
| 4,808,115 A * | 2/1989 | Norton | ................... | G02B 6/381 439/79 |
| 4,885,126 A * | 12/1989 | Polonio | ................... | H05K 3/325 361/757 |
| 5,344,113 A * | 9/1994 | Jurek | ................... | H05K 7/2049 248/316.7 |
| 5,896,270 A * | 4/1999 | Tsui | ................... | H01L 23/4093 165/80.2 |
| 7,056,144 B2 * | 6/2006 | Barsun | ................... | G06F 1/183 439/362 |
| 2007/0086085 A1 * | 4/2007 | Kitaoka | ................ | G02B 7/004 359/362 |
| 2009/0239424 A1 * | 9/2009 | Maschke | ............. | H01L 23/4093 439/786 |
| 2012/0218716 A1 * | 8/2012 | Asakura | ............. | H01L 23/4006 361/717 |
| 2013/0083486 A1 * | 4/2013 | Heo | ................... | H01L 23/4093 361/709 |
| 2013/0308275 A1 * | 11/2013 | Yamanaka | ........... | H05K 7/2039 361/717 |
| 2014/0315437 A1 * | 10/2014 | Soo | ................... | G06K 7/0021 439/626 |
| 2015/0146380 A1 * | 5/2015 | Lu | ........................ | H05K 7/1432 361/709 |

FOREIGN PATENT DOCUMENTS

| | | |
|---|---|---|
| CN | 103429046 A | 12/2013 |
| CN | 104470346 A | 3/2015 |
| CN | 204348685 U | 5/2015 |
| CN | 104682670 A | 6/2015 |
| DE | 2625456 A1 | 12/1976 |
| DE | 112013005692 T5 | 9/2015 |
| EP | 0654176 A1 | 5/1995 |
| EP | 0654176 B1 | 5/1998 |
| EP | 2667693 A2 | 11/2013 |
| JP | 3725225 B2 | 12/2005 |

* cited by examiner

POWER MODULE ASSEMBLY AND ASSEMBLING METHOD THEREOF

CROSS-REFERENCE TO RELATED APPLICATION

This application claims priority to China Patent Application No. 201710729631.0, filed on Aug. 23, 2017, the entire contents of which are incorporated herein by reference for all purposes.

FIELD OF THE DISCLOSURE

The present disclosure relates to a power module, and more particularly to a power module assembly and an assembling method thereof.

BACKGROUND OF THE DISCLOSURE

An on-board power supply, also known as the power inverter, is a power converting device applied to the vehicle. The power converting device uses plurality of power devices to convert the external power into AC power or DC power. When the power converting device is in operation, the plurality of power devices can produce a large amount of heat. For avoiding the accumulated heat to influence the performance of the power converting device, it is desired to provide an effective thermal design for dissipating the heat generated from the power devices. Generally, the power devices which are through-hole devices and are soldered on a printed circuit board in a row. Then, the power devices are pressed to attach to the heat-dissipating housing, so as to ensure that the on-board power supply can be operated safely and reliably.

The power devices of a conventional on-board power supply are pressed to attach to the heat-dissipating housing closely by locking the screws which directly pass through the screw holes of the power devices into the heat-dissipating housing. The conventional on-board power supply employs a lot of power devices which are intensively placed together. If the power devices are mounted on the heat-dissipating housing by locking the screws which directly pass through the screw holes of the power devices into the heat-dissipating housing, it will use up manpower of large quantity and damage the power devices easily to result in serious malfunction of the on-board power supply. In addition, when the power devices are directly clamped to the heat-dissipating housing by the resilient steel sheet, the power density of the on-board power supply cannot be effectively raised.

The conventional on-board power supply assembly is still unable to meet the requirements to increase efficiency and power density, so there is a need of providing a power module assembly and an assembling method thereof to solve the problems such as heat dissipation of power devices, occupying area of power devices in the on-board power supply and installation method of the power devices.

SUMMARY OF THE DISCLOSURE

An object of the present disclosure is to provide a power module assembly and an assembling method thereof. By employing the resilient set disposed between the circuit board and the housing to clamp the power devices, the assembling structure of the power devices is optimized, and the power devices are fastened easily and firmly, and the heat-dissipating capacity of the power devices is enhanced simultaneously, and the entire power density of the power module assembly is enhanced.

Another object of the present disclosure is to provide a power module assembly and an assembling method thereof. By employing a resilient set having a resilient piece in shape of symmetrical bird wings and disposed between the circuit board and the housing, at least two through-hole power devices disposed horizontally are pushed toward the heat-dissipation surface of the housing simultaneously. Consequently, the assembling procedures of the power devices are simplified, and the labor and cost are saved, and the reliability of the assembly structure are improved.

Other object of the present disclosure is to provide a power module assembly and an assembling method thereof. By employing a resilient set having a resilient piece in shape of symmetrical bird wings to push against at least two power devices, the entire size of the heat sink in the power module assembly is reduced, and the heat-dissipating capacity is enhanced, and the overall power density is enhanced simultaneously.

In accordance with an aspect of the present disclosure, a power module assembly is provided. The power module assembly includes a housing, a circuit board, at least one resilient set, at least two power devices, and at least one fastening unit. The housing includes at least one heat-dissipation surface. The circuit board is configured to mount on the housing, wherein the circuit board comprises at least one first through hole. The at least one resilient set is disposed between the housing and the circuit board. The resilient set includes at least one resilient piece and each resilient piece comprises a base section and two pushing fingers. The two pushing fingers are outwardly extended from two opposite edges of the base section respectively. The at least two power devices are electrically connected to the circuit board and located between the resilient set and the heat-dissipation surface of the housing. The two power devices are opposite to the two pushing fingers of the resilient piece respectively. The at least one fastening unit is disposed between the two power devices, connected to the base section of the resilient piece through the first through hole and driving the base section of the resilient piece, so that the two pushing fingers of the resilient piece push against the two power devices respectively and the two power devices are attached to the heat-dissipation surface.

In an embodiment, the resilient set further includes an insulation carrier, wherein the insulation carrier comprises an accommodating space, the resilient piece is pre-disposed in the accommodating space of the insulation carrier, and the two pushing fingers are partially contacted with the insulation carrier respectively, wherein the insulation carrier includes at least one second through hole and the fastening unit is connected to the base section through the first through hole and the second through hole, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

In an embodiment, the fastening unit includes a fastening part and a limiting element, and the base section comprises a third through hole, and the housing comprises at least one first recess, wherein the limiting element is received in the first recess, and the fastening part is inserted into the limiting element through the first through hole, the second through hole and the third through hole, so that the fastening unit is connected with the base section and drives the base section to move towards the circuit board, wherein while the fastening part is locked into the limiting element, the limiting element is moved towards the circuit board, wherein the fastening part and the limiting element are a bolt and a nut respectively.

In an embodiment, the fastening part and the limiting element are a bolt and a nut respectively.

In an embodiment, the limiting element is embedded in the first recess through an insulation sleeve, wherein the insulation sleeve is a hexagonal plastic sleeve.

In an embodiment, the resilient set further includes an insulation carrier, wherein the insulation carrier comprises an accommodating space and a baseplate, wherein the accommodating space is constructed below the baseplate, the baseplate comprises at least one first opening, the insulation carrier further comprises at least one accommodating groove, and the accommodating groove is disposed between two opposite edges of the first opening and divides the first opening into two partial openings, wherein the accommodating groove includes an opening portion facing the first opening, the two pushing fingers of the resilient piece are suspended in the corresponding two partial openings of the first opening respectively, the base section of the resilient piece is received in the accommodating groove, and the fastening unit is connected to the base section through the first through hole, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

In an embodiment, the fastening unit includes a fastening part and a limiting element, and the base section comprises a third through hole, and the accommodating groove is located between the two power devices and the accommodating groove further comprises at least one second recess, wherein the limiting element is embedded in the second recess of the accommodating groove, and the fastening part is inserted into the limiting element through the first through hole and the third through hole, so that the fastening unit is connected with the base section and drives the base section to move towards the circuit board, wherein while the fastening part is locked into the limiting element, the limiting element is moved towards the circuit board.

In an embodiment, the fastening part and the limiting element are a bolt and a nut respectively.

In an embodiment, the limiting element is embedded in the second recess through an insulation sleeve, wherein the insulation sleeve is a hexagonal plastic sleeve.

In an embodiment, the resilient set further includes a plate and the plate is disposed between the insulation carrier and the circuit board, wherein the plate comprises at least one second opening, the fastening unit is connected to the base section through the first through hole and the second opening, and the two pushing fingers of the resilient piece are partially contacted with the plate respectively, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing.

In an embodiment, the plate further includes at least two stopping parts disposed nearby two opposite edges of the second opening and extended towards the heat-dissipation surface to limit a deformation of the resilient piece, wherein while the two power devices are clamped on the housing, the two stopping parts touch the base section.

In an embodiment, the two pushing fingers are connected to each other through the base section and constructed to form an M-word shape or a bird-wings shape.

In an embodiment, a width of the accommodating groove is identical with a width of the accommodating space or a width of the accommodating groove is less than a width of the accommodating space.

In an embodiment, the insulation carrier includes four lateral walls, the accommodating space is formed by the baseplate and the lateral walls, wherein a height of the four lateral walls are the same, or a height of two opposite lateral walls are higher than a height of the other lateral walls and a height of the accommodating space is identical with the height of the higher two opposite lateral walls.

In an embodiment, the insulation carrier includes four lateral walls and four longitudinal walls and the four lateral walls are connected between any adjacent two of the four longitudinal walls, wherein a height of the four lateral walls is less than a height of the four longitudinal walls and a height of the accommodating groove is identical with the height of the four longitudinal walls.

In an embodiment, while the resilient set includes more than one resilient piece, and the baseplate comprises more than one first opening, the insulation carrier further includes at least one supporting wall located between two of the first openings, disposed on the baseplate of the insulation carrier and extended from the baseplate towards the heat-dissipation surface to separate the adjacent two power devices, wherein the supporting wall and the baseplate of the insulation carrier are integrally formed.

In an embodiment, the power module assembly further includes two connection sets disposed between the housing and the circuit board and located nearby two opposite edges of the heat-dissipation surface to mount the circuit board on the housing; wherein each connection set comprises a supporting column, a mounting part, a first connection part and a second connection part, the first connection part and the second connection part are disposed on two ends of the supporting column respectively, wherein the circuit board comprises a first mounting hole and the mounting part is inserted and locked into the first connection part through the first mounting hole, wherein the housing comprises a second mounting hole, and the second connection part is inserted and locked into the second mounting hole to mount the circuit board on the housing.

In an embodiment, the supporting column is an insulator, wherein the first connection part is a nut and the mounting part is a bolt inserted and locked into the supporting column through the first mounting hole, wherein the second connection part is a bolt embedded in the supporting column and inserted and locked into the second mounting hole.

In an embodiment, each of the two power devices includes a main body and plural pins, wherein the plural pins are inserted on the circuit board and electrically connected with the circuit board, and the main body disposed between the resilient set and the heat-dissipation surface of the housing.

In an embodiment, each of the two power devices includes a plug-in power transistor, wherein the housing further includes a liquid cooling unit or a heat sink thermally coupled with the heat-dissipation surface.

In accordance with another aspect of the present disclosure, an assembling method of a power module is provided.

The assembling method for the power module includes steps of: (a) providing a housing including at least one heat-dissipation surface; (b) providing a circuit board and at least two power devices, wherein the circuit board includes at least one first through hole; (c) providing a resilient set disposed between the housing and the circuit board, wherein the resilient set includes at least one resilient piece and each resilient piece comprises a base section and two pushing fingers, wherein the two pushing fingers are outwardly extended from two opposite edges of the base section respectively, wherein the two power devices are located between the resilient set and the heat-dissipation surface of the housing and opposite to the two pushing fingers of the resilient piece, respectively; (d) providing at least one fastening unit disposed between the two power devices, wherein the fastening unit is connected to the base section of the resilient piece through the first through hole and drives the base section of the resilient piece, so that the two pushing fingers of the resilient piece push against the two power devices respectively and the two power devices are attached to the heat-dissipation surface; and (e) electrically connecting the at least two power devices to the circuit board.

In an embodiment, the resilient set further includes an insulation carrier, wherein the insulation carrier includes an accommodating space, the resilient piece is pre-disposed in the accommodating space of the insulation carrier, and the two pushing fingers are partially contacted with the insulation carrier respectively, wherein the insulation carrier comprises at least one second through hole and the fastening unit is connected to the base section through the first through hole and the second through, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

In an embodiment, the fastening unit includes a fastening part and a limiting element, and the base section includes a third through hole, and the housing comprises at least one first recess, wherein the limiting element is received in the first recess, the fastening part is inserted into the limiting element through the first through hole, the second through hole and the third through hole, so that the fastening unit is connected with the base section and drives the base section to move towards the circuit board, wherein while the fastening part is locked into the limiting element, the limiting element is moved towards the circuit board.

In an embodiment, the fastening part and the limiting element are a bolt and a nut respectively.

In an embodiment, the resilient set further includes an insulation carrier, wherein the insulation carrier comprises an accommodating space and a baseplate, wherein the accommodating space is constructed below the baseplate, the baseplate comprises at least one first opening, the insulation carrier further includes at least one accommodating groove, and the accommodating groove is disposed between two opposite edges of the first opening and divides the first opening into two partial openings, wherein the accommodating groove includes an groove opening facing the first opening, the two pushing fingers of the resilient piece are suspended in the corresponding two partial openings of the first opening respectively, the base section of the resilient piece is received in the accommodating groove, and the fastening unit is connected to the base section through the first through hole, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

In an embodiment, the fastening unit includes a fastening part and a limiting element, and the base section comprises a third through hole, and the accommodating groove is located between the two power devices and the accommodating groove further comprises at least one second recess, wherein the limiting element is embedded in the second recess of the accommodating groove, and the fastening part is inserted into the limiting element through the first through hole and the third through hole, so that the fastening unit is connected with the base section and drives the base section to move towards the circuit board, wherein while the fastening part is locked into the limiting element, the limiting element is moved towards the circuit board.

In an embodiment, the fastening part and the limiting element are a bolt and a nut respectively.

In an embodiment, the resilient set further includes a plate and the plate is disposed between the insulation carrier and the circuit board, wherein the plate includes at least one second opening, the fastening unit is connected to the base section through the first through hole and the second opening, and the two pushing fingers of the resilient piece are partially contacted with the plate respectively, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing.

In an embodiment, the plate further includes at least two stopping parts disposed nearby two opposite edges of the second opening and extended towards the heat-dissipation surface to limit a deformation of the resilient piece, wherein while the two power devices are clamped on the housing, the two stopping parts touch the base section.

In an embodiment, the two pushing fingers are connected to each other through the base section and constructed to form an M-word shape or a bird-wings shape.

In an embodiment, a width of the accommodating groove is identical with a width of the accommodating space or a width of the accommodating groove is less than a width of the accommodating space.

In an embodiment, the assembling method further includes a step of (e0) providing two connection sets disposed between the housing and the circuit board and located nearby two opposite edges of the heat-dissipation surface to mount the circuit board on the housing; wherein each connection set includes a supporting column, a mounting part, a first connection part and a second connection part, the first connection part and the second connection part are disposed on two ends of the supporting column respectively, wherein the circuit board comprises a first mounting hole and the mounting part is engaged with the first connection part through the first mounting hole, wherein the housing comprises a second mounting hole, and the second connection part is inserted and locked into the second mounting hole to mount the circuit board on the housing.

In an embodiment, each of the two power devices includes a main body and plural pins, wherein the plural pins are inserted on the circuit board and electrically connected with the circuit board, and the main body disposed between the resilient piece and the heat-dissipation surface of the housing.

In an embodiment, wherein the housing further comprises a liquid cooling unit or a heat sink thermally coupled with the heat-dissipation surface.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
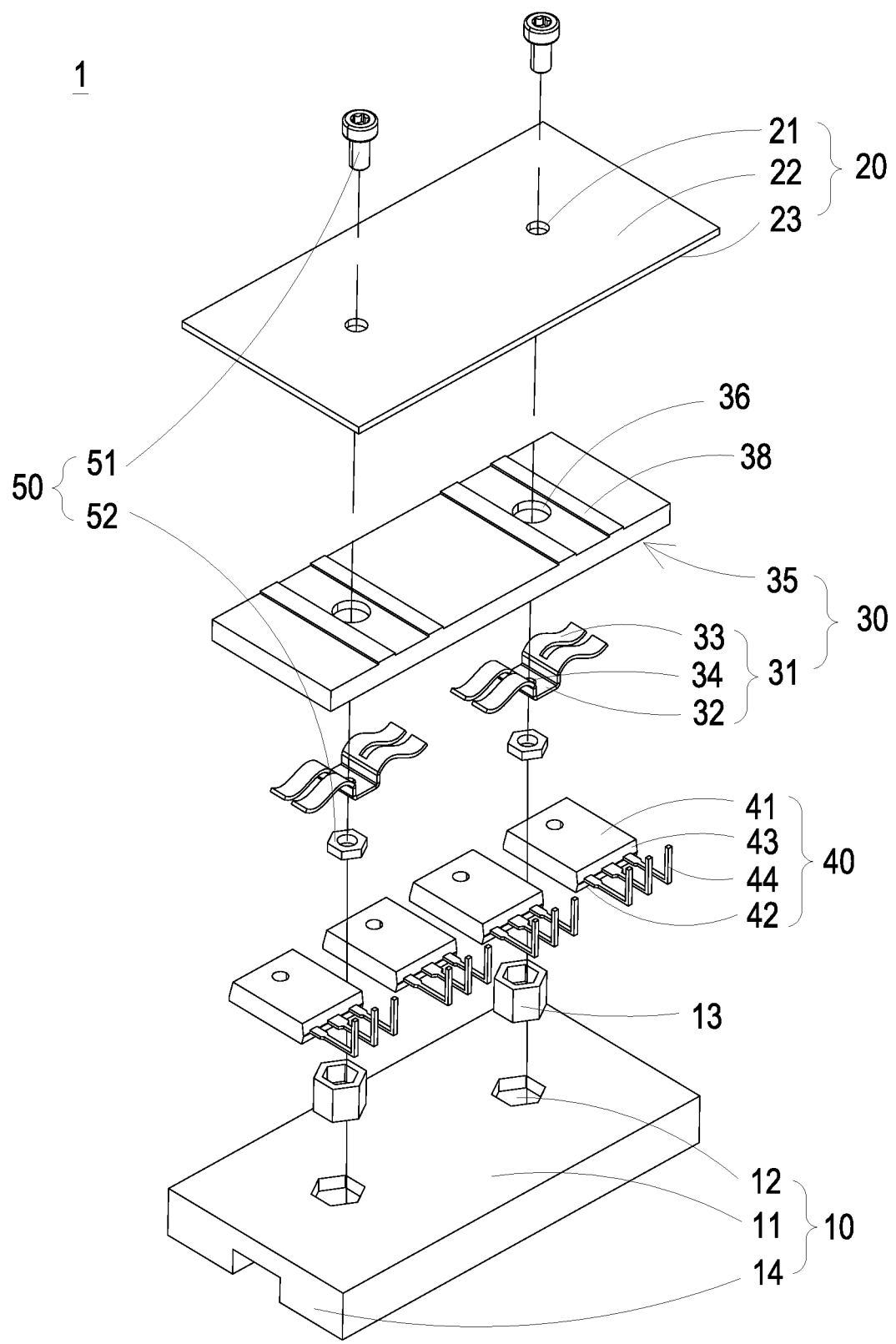
FIG. 1 is an exploded view illustrating the power module assembly according to a first embodiment of the present disclosure.
Figure 2:
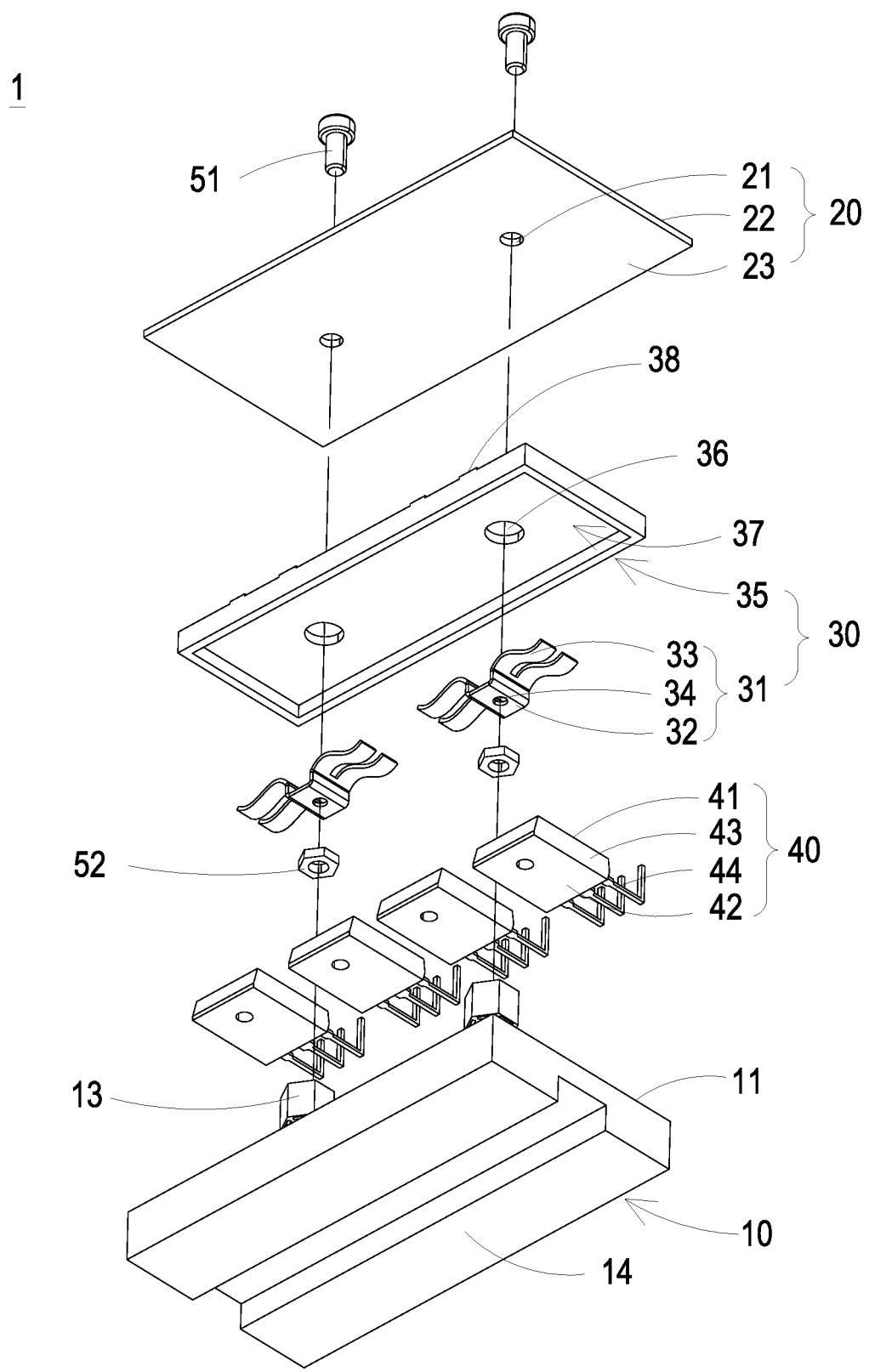
FIG. 2 is an exploded view illustrating the power module assembly from another perspective point according to the first embodiment of the present disclosure.
Figure 3:
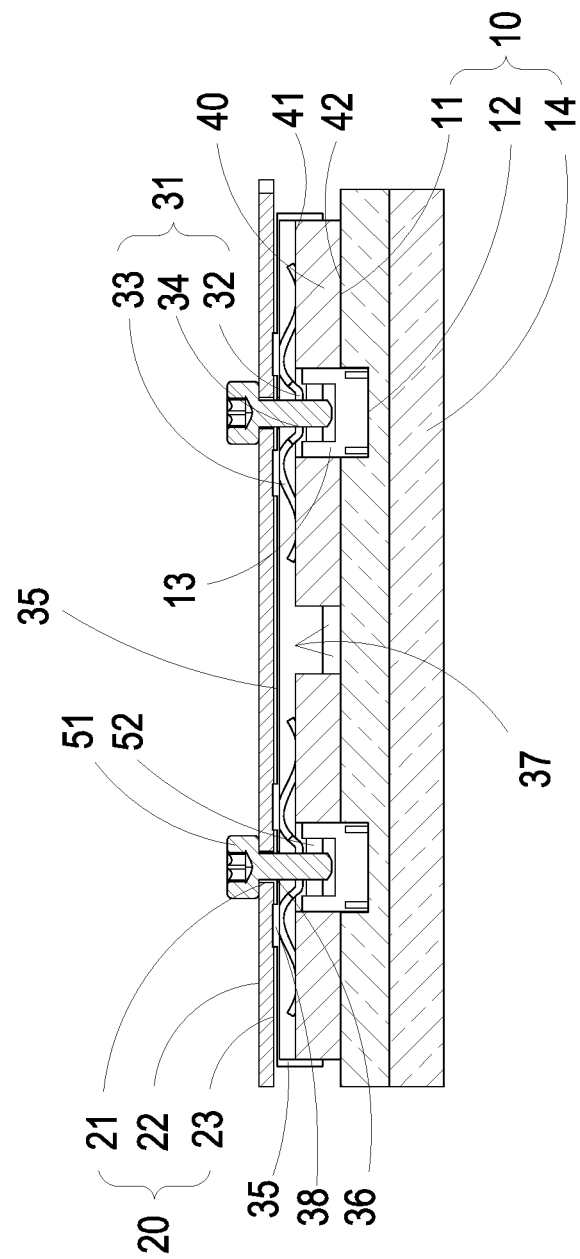
FIG. 3 is a cross sectional view illustrating the power module assembly according to the first embodiment of the present disclosure.

FIGS. 1 and 2 are an exploded view illustrating the power module assembly from different perspective points according to the first embodiment of the present disclosure. FIG. 3 is a cross sectional view illustrating the power module assembly according to the first embodiment of the present disclosure. Firstly, as shown in FIGS. 1, 2 and 3, the power module assembly 1 includes a housing 10, a circuit board 20, at least one resilient set 30, at least two power devices 40 and at least one fastening unit 50. The housing 10 includes at least one heat-dissipation surface 11. The circuit board 20 is configured to mount on the housing 10. The circuit board 20 includes at least one first through hole 21, a first surface 22 and a second surface 23. The resilient set 30 is disposed between the housing 10 and the circuit board 20. In the embodiment, the resilient set 30 includes at least one resilient piece 31. Each resilient piece 31 includes a base section 32 and two pushing fingers 33. The two pushing fingers 33 are outwardly extended from two opposite edges of the base section 32 respectively. The two power devices 40 are electrically connected to the circuit board 20 and located between the resilient set 30 and the heat-dissipation surface 11 of the housing 10. Moreover, the two power devices 40 are opposite to the two pushing fingers 33 of the resilient piece 31 respectively. The fastening unit 50 is disposed between the two power devices 40, connected to the base section 32 of the resilient piece 31 through the first through hole 21 and driving the base section 32 of the resilient piece 31, so that the two pushing fingers 33 of the resilient piece 31 push against the two power devices 40 respectively and the two power devices 40 are attached to the heat-dissipation surface 11. Consequently, it tends to reduce the thermal contact resistance. In the embodiment, the housing 10 further includes a liquid cooling unit or a heat sink 14 thermally coupled with the heat-dissipation surface 11. In the embodiment, the liquid cooling unit or the heat sink 14 and the heat-dissipation surface 11 are a part of the housing 10, integrally formed, and disposed on two opposite surfaces of the housing 10. Alternatively, in other embodiments, the heat-dissipation surface 11 and the liquid cooling unit or the heat sink 14 are combined by means of assembling. The resilient set 30 of the power module assembly 1 is disposed between the circuit board 20 and the housing 10 to push against the power devices 40 and to optimize the assembling structure of the power devices 40. Consequently, the structure can be fastened easily and firmly, the heat-dissipating capacity of the structure is enhanced simultaneously, and the entire power density of the power module assembly 1 is enhanced.

In the embodiment, the power device 40 includes a first side 41, a second side 42, a main body 43 and plural pins 44. The first side 41 and the second side 42 are opposite to each other. The plural pins 44 are inserted on the circuit board 20 and electrically connected with the circuit board 20, and the main body 43 disposed between the resilient set 30 and the heat-dissipation surface 11 of the housing 10. For example, the plural pins 44 are soldered on the circuit board 20. The resilient set 30 further includes an insulation carrier 35. The insulation carrier 35 includes an accommodating space 37. The resilient piece 31 is pre-disposed in the accommodating space 37 of the insulation carrier 35. The two pushing fingers 33 of the resilient piece 31 are partially contacted with the insulation carrier 35 respectively. In the embodiment, the insulation carrier 35 provides a supporting function for the two pushing fingers 33 of the resilient piece 31 and an insulation function for insulating between the circuit board 20 and the resilient piece 31 at the same time. The insulation carrier 35 further includes at least one second through hole 36 and the fastening unit 50 is connected to the base section 32 through the first through hole 21 and the second through hole 36. While the fastening unit 50 drives the base section 32 to move towards the circuit board 20, the base section 32 drives each pushing finger 33 to push against the first side 41 of the corresponding power device 40, so that the second side 42 of each of the two power devices 40 is attached to the heat-dissipation surface 11 and the two power devices 40 are clamped on the housing 10. In the embodiment, the fastening unit 50 further includes a fastening part 51 and a limiting element 52. The base section 32 of the resilient piece 31 includes a third through hole 34. The fastening part 51 of the fastening unit 50 is inserted into the limiting element 52 through the first through hole 21, the second through hole 36 and the third through hole 34. Consequently, the fastening unit 50 is connected with the base section 32 and drives the base section 32 to move towards the circuit board 20. Namely, while the fastening part 51 is locked into the limiting element 52, the limiting element 52 is moved towards the circuit board 20 and drives the base section 32 to move towards the circuit board 20. Furthermore, the housing 10 further includes at least one first recess 12 and the limiting element 52 of the resilient piece 31 is embedded in the first recess 12. Moreover, the limiting element 52 embedded in the first recess 12 is movable in the axial direction of the first recess 12, but fail to rotate around the axial direction of the first recess 12. In an embodiment, the limiting element 52 of the fastening unit 50 is embedded in the first recess 12 of the housing 10 through an insulation sleeve 13. In an embodiment, the limiting element 52 and the insulation sleeve 13 are integrally formed or assembled to form an integral structure. The limiting element 52 embedded in the insulation sleeve 13 is movable in the axial direction of insulation sleeve 13, but fail to rotate around the axial direction of the insulation sleeve 13. Moreover, the insulation sleeve 13 provides an insulation function between the circuit board 20 and the housing 10. In the embodiment, the fastening part 51 and the limiting element 52 can be for example but not limited to a bolt and a nut respectively. The insulation sleeve 13 can be for example but not limited to a hexagonal plastic sleeve. On the other hand, the insulation carrier 35 further includes at least two supporting ribs 38 disposed nearby the opposite sides of the second through hole 36. When the limiting element 52 of the fastening unit 50 drives the base section 32 to move towards the circuit board 20 and the two pushing fingers 33 contact with and push against the insulation carrier 35, the gap between the insulation carrier 35 and the circuit board 20 is maintained by the two supporting ribs 38. In an embodiment, the two supporting ribs 38 are disposed relative to the position where the two pushing fingers 33 of the resilient piece 31 contact with the insulation carrier 35, so as to support the circuit board 20 and maintain the gap between the insulation carrier 35 and the circuit board 20. Consequently, while the two pushing fingers 32 contact and push against the insulation carrier 35, the insulation carrier 35 is prevented from damaging the circuit distributed on the circuit board 20.

Notably, in the embodiment, the two pushing fingers 33 of the resilient piece 31 of the resilient set 30 are connected to each other through the base section 32 and constructed to form an M-word shape or a bird-wings shape. By employing the resilient piece 31 of the resilient set 30 having the symmetrical bird-wings shape and disposed between the circuit board 20 and housing 10, while the limiting element 52 of the fastening unit 50 drives the base section 32 to move towards the circuit board 20, the at least two through-hole power devices 40 disposed horizontally are driven to push against the heat-dissipation surface 11 of the housing 10. Consequently, the disposing and fastening procedures are simplified and thus the purposes of saving the labor, reducing the production cost and improving the reliability of the assembly structure are achieved. Moreover, the entire size of the power module assembly 1 is reduced, the heat-dissipating capacity of the power device is enhanced, and the purpose of enhancing the overall power density is achieved simultaneously.

Figure 4:
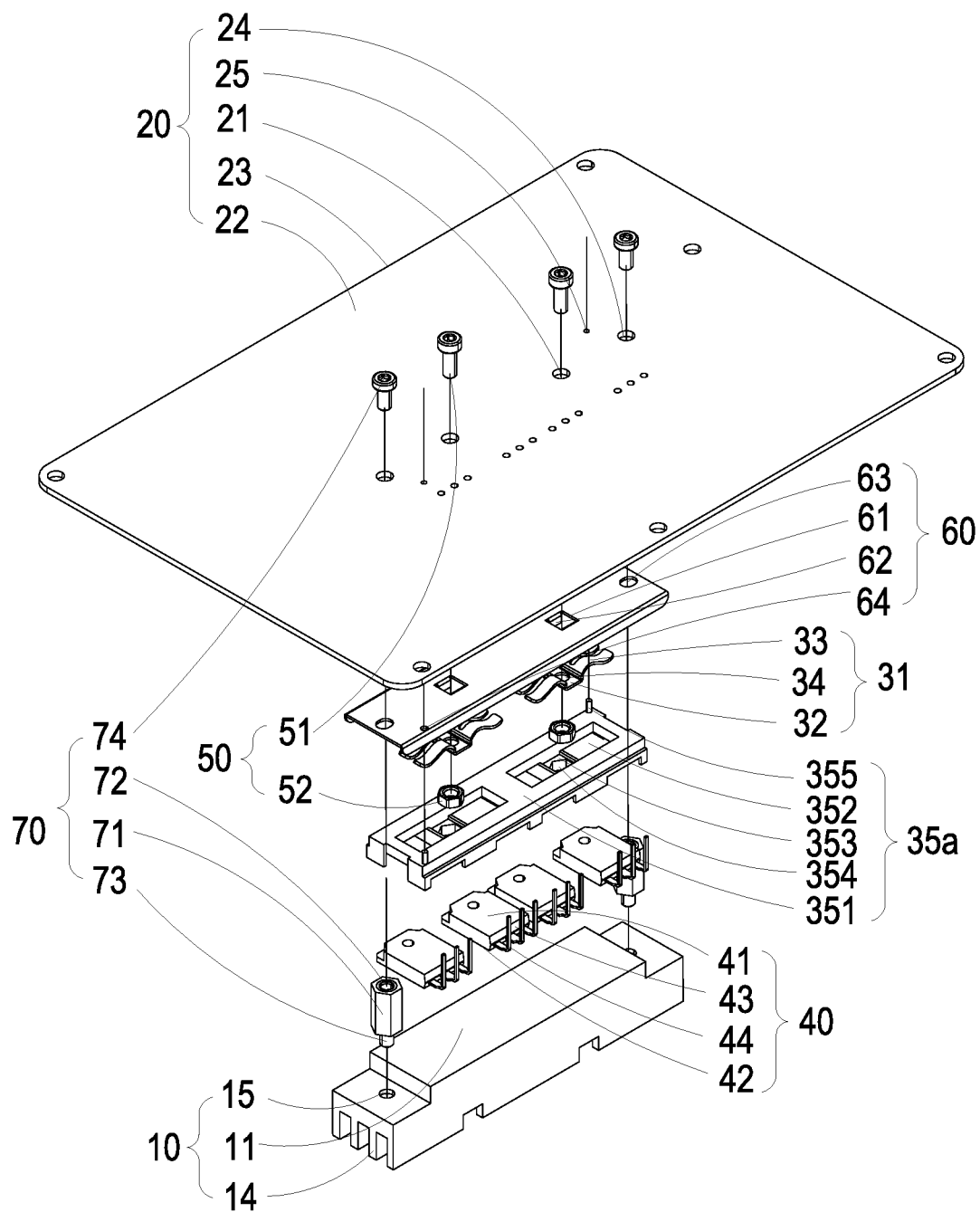
FIG. 4 is an exploded view illustrating the power module assembly according to a second embodiment of the present disclosure.
Figure 5:
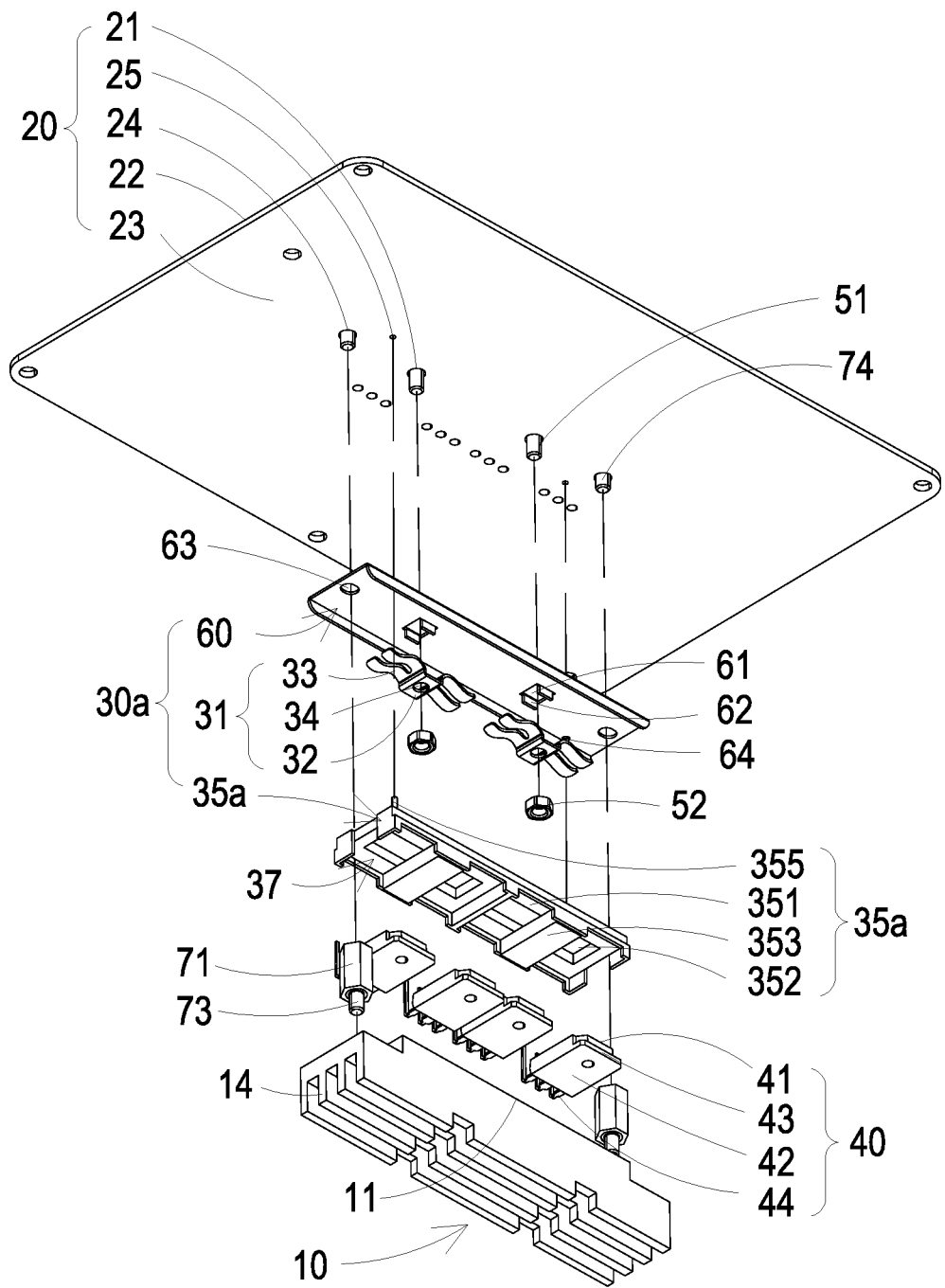
FIG. 5 is an exploded view illustrating the power module assembly from another perspective point according to the second embodiment of the present disclosure.
Figure 6:
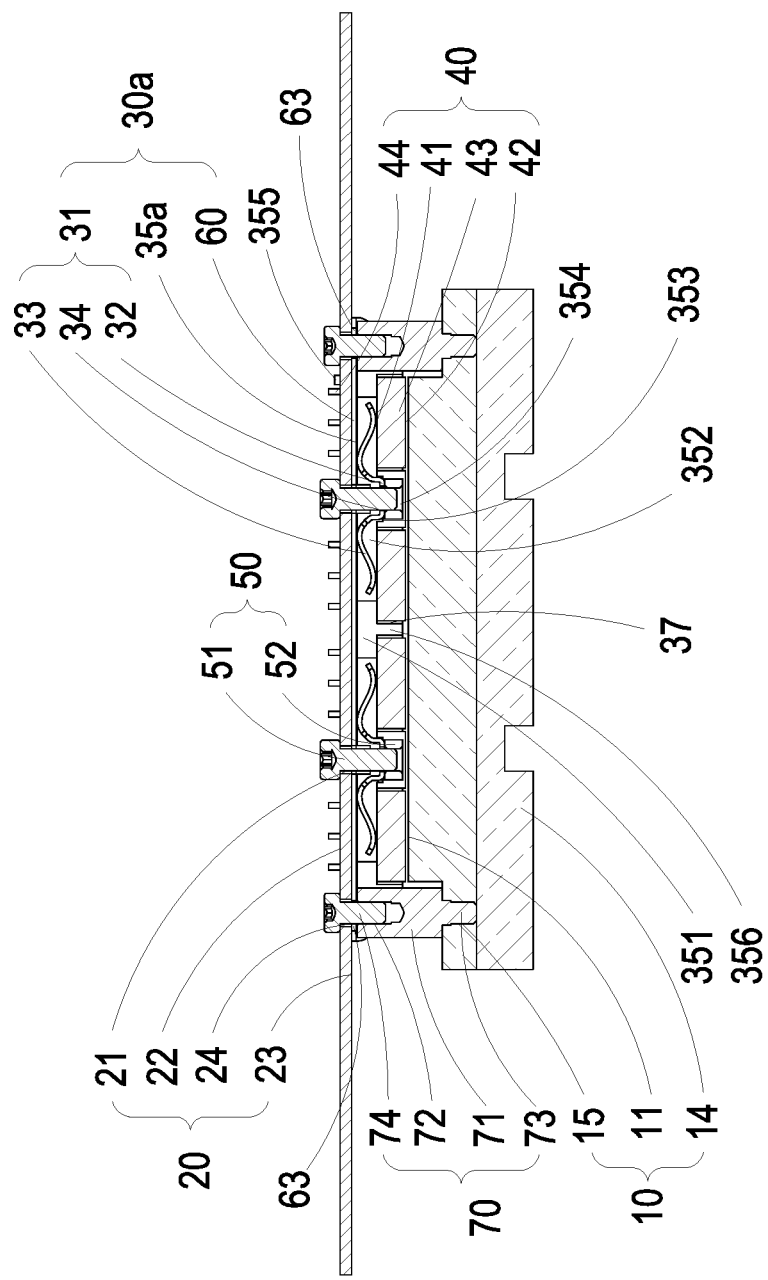
FIG. 6 is a cross sectional view illustrating the power module assembly according to the second embodiment of the present disclosure.

FIGS. 4 and 5 are an exploded view illustrating the power module assembly from another perspective point according to the second embodiment of the present disclosure. FIG. 6 is a cross sectional view illustrating the power module assembly according to the second embodiment of the present disclosure. In the embodiment, the structures, elements and functions of the power module assembly 1a are similar to those of the power module assembly 1 in FIGS. 1 to 3, and are not redundantly described herein. Different from the power module assembly 1 of FIGS. 1 to 3, in the embodiment, the resilient set 30a further includes a resilient piece 31, an insulation carrier 35a and a plate 60. The insulation carrier 35a includes an accommodating space 37, a baseplate 351, at least one first opening 352 and at least one accommodating groove 353. The accommodating space 37 is constructed below the baseplate 351. The first opening 352 is disposed on the baseplate 351. The accommodating groove 353 is disposed between two opposite edges of the first opening 352 and divides the first opening 352 into two partial openings, as shown in FIGS. 4 to 6. In addition, the accommodating groove 353 includes a groove opening facing to the first opening 352. The two pushing fingers 33 of the resilient piece 31 are suspended in the corresponding two partial openings of the first opening 352, respectively. The base section 32 of the resilient piece 31 is received in the accommodating groove 353. In the embodiment, the fastening unit 50 is connected to the base section 32 of the resilient piece 31 though the first through hole 21. While the fastening unit 50 drives the base section 32 of the resilient piece 31 to move towards the circuit board 20, the base section 32 drives each pushing finger 33 to push against the first side 41 of the corresponding power device 40. Consequently, the second side 42 of each of the two power devices 40 is attached to the heat-dissipation surface 11 and the two power devices 40 are clamped on the housing 10. Moreover, the entire size of the power module assembly 1a is reduced, the heat-dissipating capacity of the power device is enhanced, and the purpose of enhancing the overall power density is achieved simultaneously. Similarly, in the embodiment, the housing 10 further includes a liquid cooling unit or a heat sink 14 thermally coupled with the heat-dissipation surface 11 for enhancing the heat-dissipating capacity. The related applications are not redundantly described herein.

In the embodiment, the fastening unit 50 includes a fastening part 51 and a limiting element 52. The base section 32 of the resilient piece 31 includes a third through hole 34. The fastening part 51 and the limiting element 52 can be for example but not limited to a bolt and a nut respectively. The fastening part 51 of the fastening unit 50 is inserted into the limiting element 52 through the first through hole 21 of the circuit board 20 and the third through hole 34 of the base section 32, so that the fastening unit 50 is connected with the base section 32 of the resilient piece 31 and drives the base section 32 to move towards the circuit board 20. In the embodiment, the accommodating groove 353 is located between the two power devices 40 to separate the adjacent two power devices 40 away from each other. The accommodating groove 353 further includes at least one second recess 354 and the limiting element 52 is received in the second recess 354 of the accommodating groove 353. The limiting element 52 received in the second recess 354 is movable in the axial direction of the second recess 354, but fail to rotate around the axial direction of the second recess 354. In an embodiment, the limiting element 52 of the fastening unit 50 is received in the second recess 354 of the accommodating groove 353 through an insulation sleeve (not shown). In an embodiment, the limiting element 52 and the insulation sleeve are integrally formed or assembled to form an integral structure. The limiting element 52 received in the insulation sleeve is movable in the axial direction of insulation sleeve, but fail to rotate around the axial direction of the insulation sleeve. Moreover, the insulation sleeve provides an insulation function between the circuit board 20 and the housing 10. It is not an essential feature to limit the present disclosure, and the related applications are not redundantly described herein. It is noted that, in the embodiment, the resilient set 30a further includes a plate 60, which can be constructed by for example but not limited to a rigid or metal materials. The plate 60 is disposed between the insulation carrier 35a and the circuit board 20. The plate 60 includes at least one second opening 61. The fastening unit 50 is connected to the base section 32 of the resilient piece 31 through the first through hole 21 of the circuit board 20 and the second opening 61 of the plate 60. The two pushing fingers 33 of the resilient piece 31 are partially contacted with the plate 60 respectively. Consequently, the plate 60 provides a supporting function for the two pushing fingers 33 of the resilient piece 31. While the fastening unit 50 drives the base section 32 of the resilient piece 31 to move towards the circuit board 20, the base section 32 drives each pushing finger 33 to push against the first side 41 of the corresponding power device 40. Consequently, the second side 42 of each of the two power devices 40 is attached to the heat-dissipation surface 11 and the two power devices 40 are clamped on the housing 10. In the embodiment, the plate 60 further includes at least two stopping parts 62 disposed nearby two opposite edges of the second opening 61 and extended towards the heat-dissipation surface 11 of the housing 10 to limit a deformation of the resilient piece 31. While the fastening unit 50 drives the base section 32 to move towards the circuit board 20, the two stopping parts 62 touch the base section 32 to limit the deformation of the two pushing fingers 33 of the resilient piece 31 and prevent the resilient piece 31 from deforming to a flat. Consequently, it facilitates that the two power devices 40 are clamped on the housing 10 firmly.

Similarly, in the embodiment, the resilient piece 31 of the resilient set 30a includes two pushing fingers 33 connected to each other through the base section 32 and constructed to form an M-word shape or a bird-wings shape. By employing the resilient piece 31 of the resilient set 30a having the symmetrical bird-wings shape and disposed between the circuit board 20 and housing 10, while the limiting element 52 of the fastening unit 50 drives the base section 32 to move towards the circuit board 20, the at least two through-hole power devices 40 disposed horizontally are driven to push against the heat-dissipation surface 11 of the housing 10. Consequently, the disposing and fastening procedures are simplified and thus the purposes of saving the labor, reducing the production cost and improving the reliability of the assembly structure are achieved. Moreover, the entire size of the power module assembly 1 is reduced, the heat-dissipating capacity of the power device is enhanced, and the purpose of enhancing the overall power density is achieved simultaneously. It is noted that two pushing fingers 33 are connected to each other through the base section 32 and constructed to form an M-word shape or a bird-wings shape. While the base section 32 is moved towards the circuit board 20, the two pushing fingers 33 maintain the resiliency to push the corresponding two power devices 40, respectively. The number of the power devices 40 pushed by each pushing finger 33 is adjustable according to the practical. For example, two pushing fingers 33 are employed to push against two corresponding power devices 40. It is not an essential feature to limit the present disclosure. Any of at least two pushing fingers 33 connected to each other through the base section 32 and constructed the resilient piece 31 maintaining the resiliency can be employed in the power module assembly 1a of the present disclosure and the present disclosure is not limited thereto.

Figure 7A:
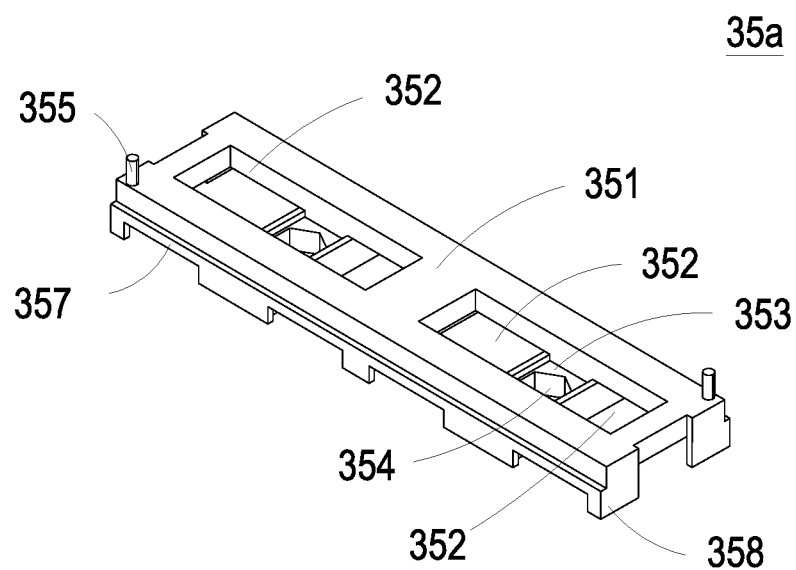
FIG. 7A is a schematic view illustrating an exemplary insulation carrier of the power module assembly.
Figure 7B:
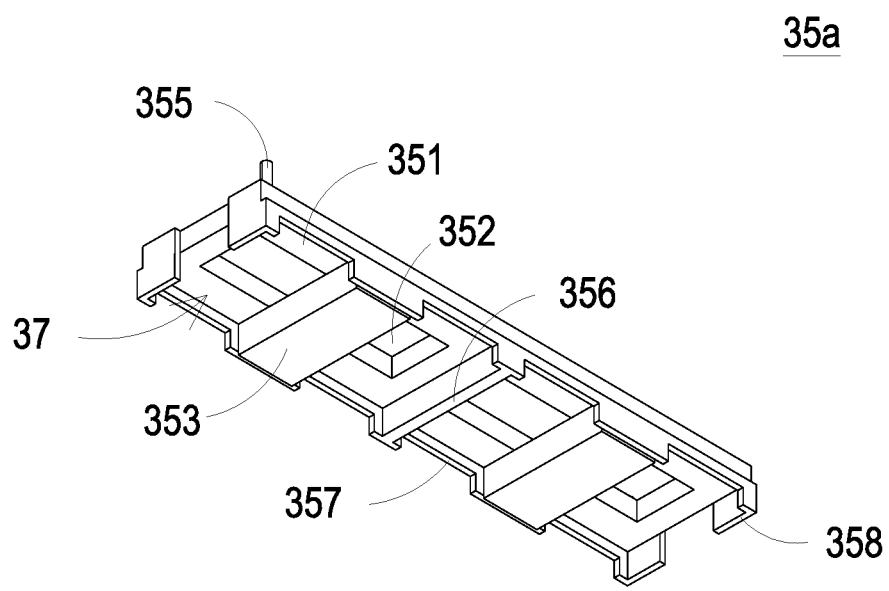
FIG. 7B is a schematic view illustrating the insulation carrier of FIG. 7A from another perspective point.
Figure 7C:
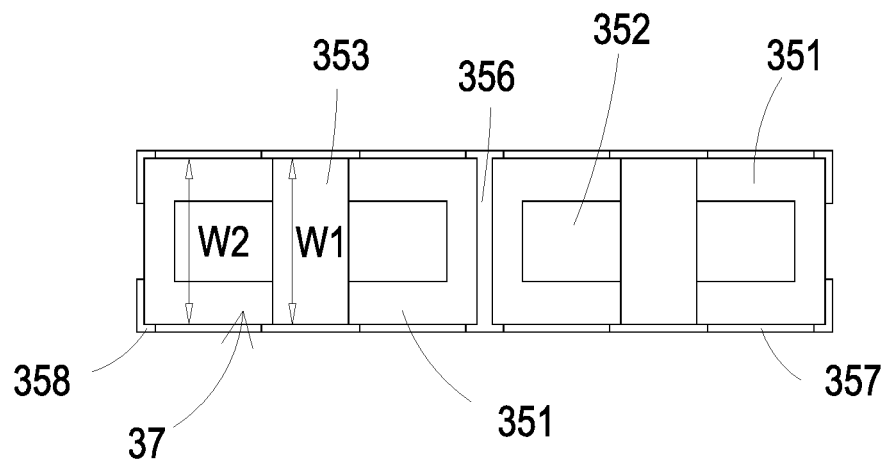
FIG. 7C is a bottom view illustrating the insulation carrier of FIG. 7A.
Figure 7D:
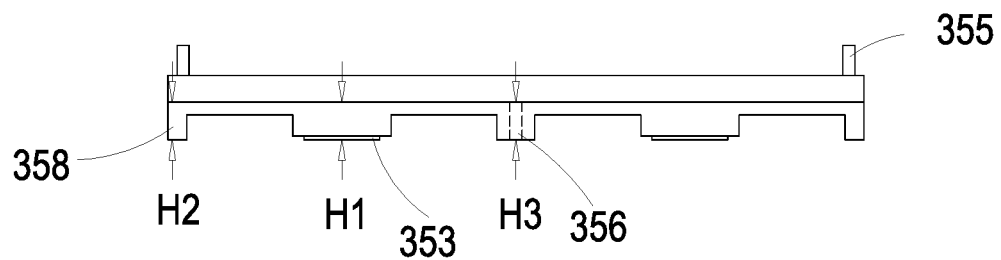
FIG. 7D is a lateral view illustrating the insulation carrier of FIG. 7A.

On the other hand, in the embodiment, the power device 40 includes a main body 43 and plural pins 44. The plural pins 44 are inserted on the circuit board 20 and electrically connected with the circuit board 20, and the main body 43 disposed between the resilient set 30 and the heat-dissipation surface 11 of the housing 10. In the embodiment, the insulation carrier 35a is designed according to the configuration of the resilient piece 31 of the resilient set 30a and the power devices 40. FIG. 7A is a schematic view illustrating an exemplary insulation carrier of the power module assembly. FIG. 7B is a schematic view illustrating the insulation carrier of FIG. 7A from another perspective point. FIG. 7C is a bottom view illustrating the insulation carrier of FIG. 7A. FIG. 7D is a lateral view illustrating the insulation carrier of FIG. 7A. As shown in FIGS. 7A to 7D, in the embodiment, the insulation carrier 35a includes four lateral walls 357 and four longitudinal walls 358 to construct the accommodating space 37 for accommodating the power devices 40. The four lateral walls 357 are connected between any adjacent two of the four longitudinal walls 358. In an embodiment, a height of the four lateral walls 357 is less than a height of the four longitudinal walls 358. It facilitates that the plural pins 44 of the power devices 40 are bent and inserted on the circuit board 20 and the plural pins 44 of the power device 40 are electrically connected to the circuit board 20. In the embodiment, the two power devices 40 are accommodated in the accommodating space 37 and the accommodating groove 353 is disposed between the two power devices 40. In the embodiment, the width W1 of the accommodating groove 353 is identical with the width W2 of the accommodating space 37, as shown in FIG. 7C. Furthermore, the height H1 of the accommodating groove 353 is identical with the height H2 of the four longitudinal walls 358 to facilitate accommodating the power devices 40 and providing the supporting function simultaneously, as shown in FIG. 7D. Moreover, the resilient set 30a includes more than one resilient piece 31, the insulation carrier 35a further includes at least one supporting wall 356 located between two of the first openings 352, disposed on the baseplate 351 of the insulation carrier 35a and extended from the baseplate 351 towards the heat-dissipation surface 11 of the housing 10 to separate the adjacent two power devices 40. The supporting wall 356 and the baseplate 351 of the insulation carrier 35a can be for example formed into one piece. Certainly, the height H3 of the supporting wall 356 can be for example but not limited to identical with the height H1 of the accommodating groove 353 or the height H2 of the four longitudinal walls 358. It is not an essential feature to limit the present disclosure, and the related applications are not redundantly described herein.

Figure 8A:
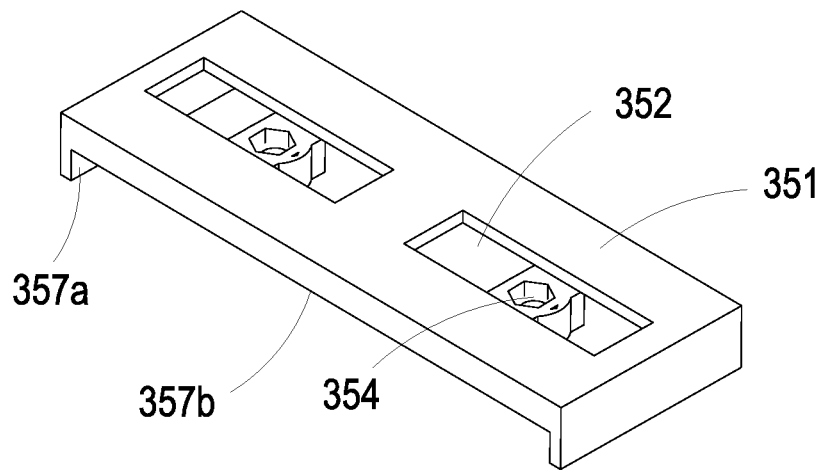
FIG. 8A is a schematic view illustrating another exemplary insulation carrier of the power module assembly.
Figure 8B:
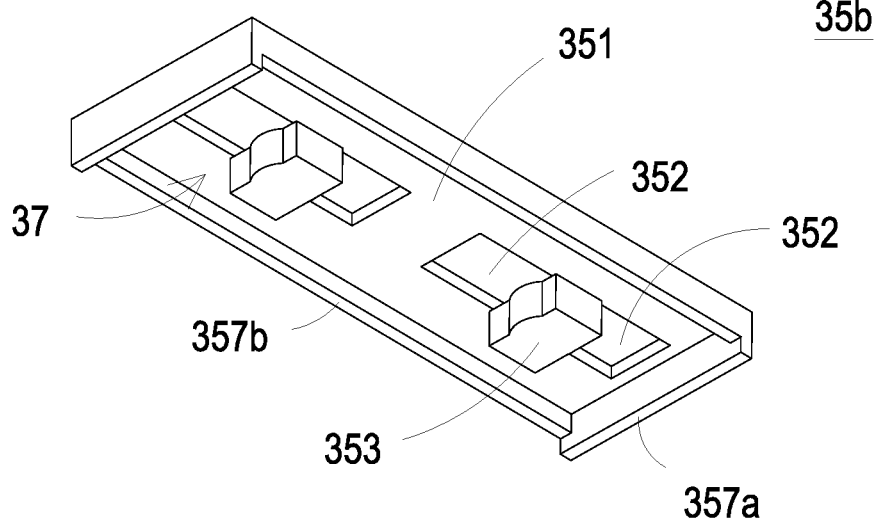
FIG. 8B is a schematic view illustrating the insulation carrier of FIG. 8A from another perspective point.
Figure 8C:
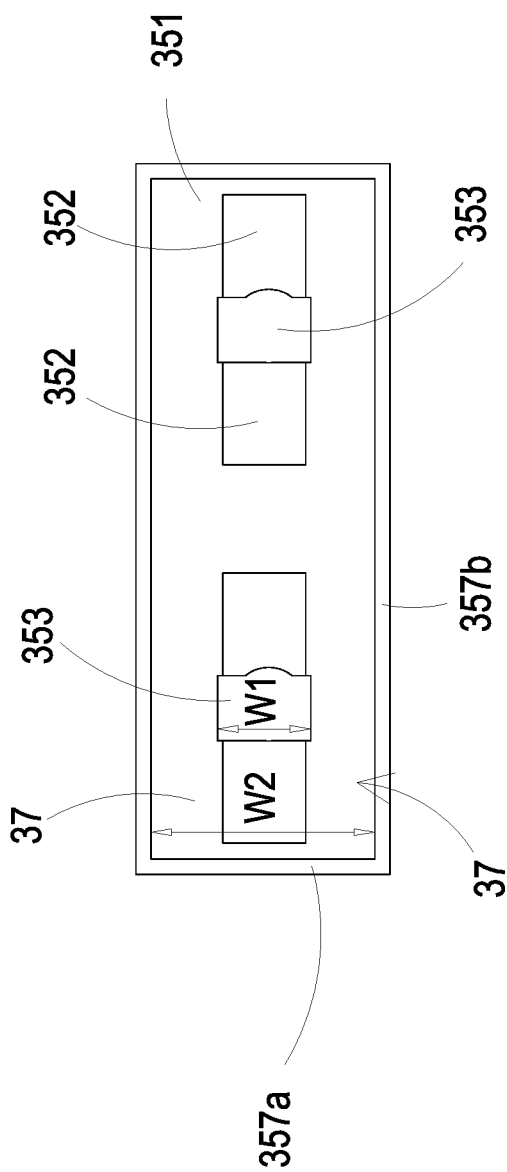
FIG. 8C is a bottom view illustrating the insulation carrier of FIG. 8A.

In addition, FIGS. 8A and 8B are a schematic view illustrating the insulation carrier of the power module assembly from different perspective points. FIG. 8C is a bottom view illustrating the insulation carrier of FIG. 8A. As shown in FIGS. 8A to 8C, in the insulation carrier 35b of the embodiment, the width W1 of the accommodating groove 353 is less than the width W2 of the accommodating space 37. The insulation carrier 35b includes four lateral walls 357a and 357b for constructing the accommodating space 37. The height of two opposite lateral walls 357a is larger than that of two opposite lateral walls 357b, and the height of the accommodating space 37 is identical with the height of the lateral walls 357a. It facilitates that the plural pins 44 of the power devices 40 are bent though the lateral wall 357b and inserted on the circuit board 20 and the plural pins 44 of the power device 40 are electrically connected to the circuit board 20. In an embodiment, the height of two opposite lateral walls 357a can be identical with that of two opposite lateral walls 357b. It is not an essential feature to limit the present disclosure, and the related applications are not redundantly described herein. In addition, the resilient set 30a includes the resilient piece 31, the insulation carrier 35a and the plate 60, and the resilient piece 31 is accommodated in the corresponding first open 352 of the insulation carrier 35a. The insulation carrier 35a further includes at least one positioning pin 355 relative to at least one positioning hole 64 of the plate 60 and at least one positioning hole 25 of the circuit board 20. Consequently, it facilitates the insulation carrier 35a, the plate 60 and the circuit board 20 to be positioned and assembled. It is not an essential feature to limit the present disclosure, and the related applications are not redundantly described herein.

It is noted that in the embodiment, the circuit board 20 is further mounted on the housing 10. As shown in FIGS. 4 to 6, the power device assembly 1a further includes two connection sets 70 disposed between the housing 10 and the circuit board 20 and located nearby two opposite edges of the heat-dissipation surface 11 to mount the circuit board 20 on the housing 10. In the embodiment, each connection set 70 includes a supporting column 71, a mounting part 74, a first connection part 72 and a second connection part 73. The first connection part 72 and the second connection part 73 are disposed on two ends of the supporting column 71 respectively. The circuit board 20 includes a first mounting hole 24, the housing 10 includes a second mounting hole 15 and the plate 60 includes a third mounting hole 63. The mounting part 74 is engaged with the first connection part 72 through the first mounting hole 24 of the circuit board 20 and the third mounting hole 63 of the plate 60. The second connection part 73 disposed on another end of the supporting column 71 is inserted and locked into the second mounting hole 15 of the housing 10, so as to mount the circuit board 20 on the housing 10. In the embodiment, the supporting column 71 of the connection set 70 can be for example but not limited to an insulator. The first connection part 72 can be for example but not limited to a nut embedded in the end of the supporting column 71 of the connection set 70. The mounting part 74 can be for example but not limited to a bolt engaged with the first connection part 72 embedded in the supporting column 71 through the first mounting hole 24 of the circuit board 20 and the third mounting hole 63 of the plate 60. The second connection part 73 can be for example but not limited to a bolt embedded in the supporting column 71 and inserted and locked into the second mounting hole 15 of the housing 10. In the embodiment, the housing 10 further includes a nut embedded in the second mounting hole 15. Namely, there is a nut with internal thread installed in the second mounting hole 15. In the embodiment, the first connection part 72 and the second connection part 73 are formed into one part, and the main body of the supporting column 71 is an insulation column so as to maintain a sufficient creepage distance between the circuit board 20 and the housing 10 and provide the insulation function. Certainly, the foregoing connection set 70 for mounting the circuit board 20 on the housing 10 is illustrative merely. Any of the connection set 70 capable of mounting the circuit board 20 on the housing 10 can be employed in the present disclosure. The related applications are not redundantly described herein.

Figure 9:
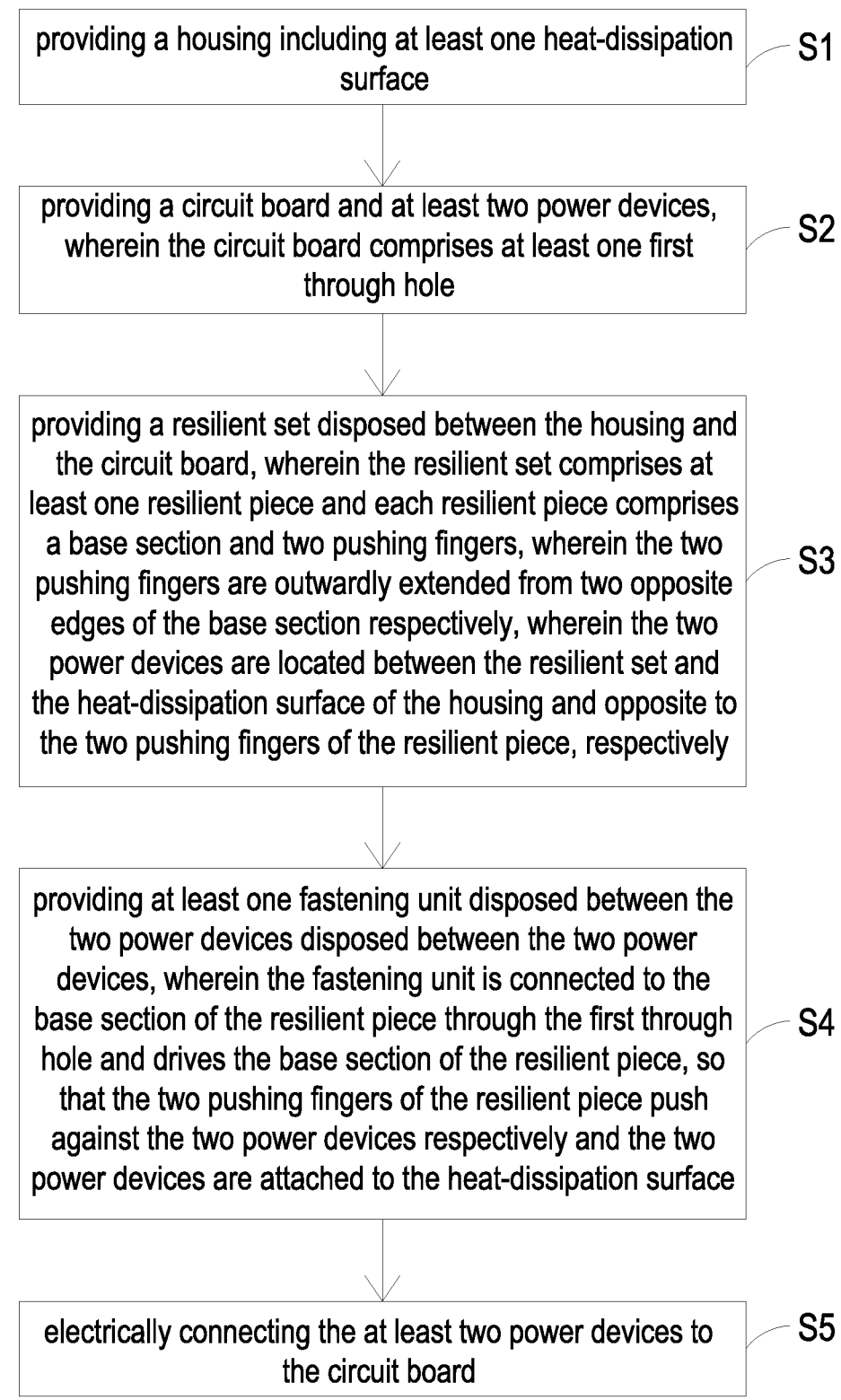
FIG. 9 is a flow chart of an assembling method for a power module assembly according to a preferred embodiment of the present disclosure.

According to the power module assembly 1 or 1a, the present disclosure also provides an assembling method of the power module assembly. FIG. 9 is a flow chart of an assembling method for a power module assembly according to a preferred embodiment of the present disclosure. As shown in FIGS. 1 to 6 and FIG. 9, firstly, a housing 10 is provided according to the assembling method of the present disclosure and the housing 10 includes at least one heat-dissipation surface 11 as shown at the step S1 of FIG. 9. On the other hand, a circuit board 20 and at least two power device 40 are provided for assembling the power module assembly 1 or 1a as shown at the step S2 of FIG. 9. In the embodiment, the circuit board 20 includes at least one first through hole 21. Afterward, a resilient set 30 or 30a is provided and disposed between the housing 10 and the circuit board 20 as shown at the step S3 of FIG. 9. In the embodiment, the resilient set 30 or 30a includes at least one resilient piece 31 and each resilient piece 31 includes a base section 32 and two pushing fingers 33. The two pushing fingers 33 are outwardly extended from two opposite edges of the base section 32 respectively. In the embodiment, the two power devices 40 are located between the resilient set 30 or 30a and the heat-dissipation surface 11 of the housing 10 and opposite to the two pushing fingers 33 of the resilient piece 30 or 30a, respectively. Then, at least one fastening unit 50 is provided and disposed between the two power devices 40 as shown at the step S4 of FIG. 9. Furthermore, the fastening unit 50 is connected to the base section 32 of the resilient piece 31 through the first through hole 21 and drives the base section 32 of the resilient piece 31, so that the two pushing fingers 33 of the resilient piece 31 push against the two power devices 40 respectively and the two power devices 40 are attached to the heat-dissipation surface 11 of the housing 10. Finally, the two power devices 40 are electrically connected to the circuit board 20, as shown at the step S5 of FIG. 9. It is noted that the resilient piece 31 of the resilient set 30 or 30a includes two pushing fingers 33 connected to each other through the base section 32 and constructed to form an M-word shape or a bird-wings shape. While the limiting element 52 of the fastening unit 50 drives the base section 32 to move towards the circuit board 20, the at least two through-hole power devices 40 disposed horizontally are driven to push against the heat-dissipation surface 11 of the housing 10. Consequently, the disposing and fastening procedures are simplified and thus the purposes of saving the labor, reducing the production cost and improving the reliability of the assembly structure are achieved. Moreover, the entire size of the power module assembly 1 or 1a is reduced, the heat-dissipating capacity of the power device is enhanced, and the purpose of enhancing the overall power density is achieved simultaneously. In addition, the housing 10 further includes a liquid cooling unit or a heat sink 14 thermally coupled with the heat-dissipation surface 11 for enhancing the heat-dissipating capacity. The related applications are not redundantly described herein.

Practically, in the embodiment, the fastening unit 50 includes a fastening part 51 and a limiting element 52. The base section 32 of the resilient piece 31 includes a third through hole 34. The fastening part 51 and the limiting element 52 can be for example but not limited to a bolt and a nut respectively. The fastening part 51 of the fastening unit 50 is inserted into the limiting element 52 through the first through hole 21 of the circuit board 20 and the third through hole 34 of the base section 32, so that the fastening unit 50 is connected with the base section 32 of the resilient piece 31 and drives the base section 32 to move towards the circuit board 20. In practical, the limiting element 52 of the fastening unit 50 is further received in the first recess 12 of the housing 10 through an insulation sleeve 13 previously. While the limiting element 52 is locked into the fastening part 51 and drives the base section 32 to move towards the circuit board 20, the two pushing fingers 33 push against the two power device 40, respectively. Consequently, the two power devices 40 are attached to the heat-dissipation surface 11 of the housing 10, as shown in FIGS. 1 to 3. Certainly, in an embodiment, the limiting element 52 can be previously received in the second recess 354 of the accommodating groove 353. While the fastening part 51 is inserted the limiting element 52 through the first through hole 21 of the circuit board 20 and the base section 32 is driven to move towards the circuit board 20, the two pushing fingers 33 push against the two power devices 40, respectively. Consequently, the two power devices 40 are attached to the heat-dissipation surface 11 of the housing 10, as shown in FIGS. 4 to 6. It is emphasized that the present disclosure is not limited to the illustrative fastening unit 50 in the foregoing embodiments. Any of fastening unit 50 capable of driving the base section 32 to move towards the circuit board 20 can be employed in the present disclosure. The related applications are not redundantly described herein.

On the other hand, in the embodiment, the circuit board 20 is further mounted on the housing 10. After the fastening unit 50 drives the base section 32 to move towards the circuit board, at least two connection sets 70 are provided according the assembling method of the present disclosure. The two connection sets 70 are disposed between the housing 10 and the circuit board 20 and located nearby two opposite edges of the heat-dissipation surface 11 to mount the circuit board 20 on the housing 10. In an embodiment, as shown in FIGS. 4 to 6, each connection set 70 includes a supporting column 71, a mounting part 74, a first connection part 72 and a second connection part 73. The first connection part 72 and the second connection part 73 are disposed on two ends of the supporting column 71 respectively. The circuit board 20 includes a first mounting hole 24, the housing 10 includes a second mounting hole 15 and the plate 60 includes a third mounting hole 63. The mounting part 74 is inserted and locked into the first connection part 72 disposed on the end of the supporting column 71 through the first mounting hole 24 of the circuit board 20 and the third mounting hole 63 of the plate 60. The second connection part 73 disposed on another end of the supporting column 71 is inserted and locked into the second mounting hole 15 of the housing 10, so as to mount the circuit board 20 on the housing 10. In the embodiment, the supporting column 71 of the connection set 70 can be for example but not limited to an insulator. The first connection part 72 can be for example but not limited to a nut embedded in the end of the supporting column 71 of the connection set 70. The mounting part 74 can be for example but not limited to a bolt inserted and locked into the first connection part 72 embedded in the supporting column 71 through the first mounting hole 24 of the circuit board 20 and the third mounting hole 63 of the plate 60. The second connection part 73 can be for example but not limited to a bolt embedded in the supporting column 71 and inserted and locked into the second mounting hole 15 of the housing 10. Certainly, the foregoing connection set 70 for mounting the circuit board 20 on the housing 10 is illustrative merely. Any of the connection set 70 capable of mounting the circuit board 20 on the housing 10 can be employed in the present disclosure. The related applications are not redundantly described herein.

On the other hand, in the embodiment, the power device 40 includes a main body 43 and plural pins 44. The plural pins 44 are inserted on the circuit board 20 and electrically connected with the circuit board 20, and the main body 43 disposed between the resilient set 30 and the heat-dissipation surface 11 of the housing 10. After the main bodies 43 of two power devices 40 are attached on the heat-dissipation surface 11 of the housing 10. In the embodiment, the at least two power devices 40 are accommodated in the accommodating space 37 of the insulation carrier 35, 35a or 35b. The insulation carrier 35, 35a or 35b can be designed according to the configuration of the power devices 40. As shown in FIGS. 1 to 3, the insulation carrier 35 includes four lateral walls and the heights of the four lateral walls are identical, so as to construct the accommodating space 37. In the embodiment, the at least two power devices 40 are partially accommodated in the accommodating space 37 of the insulation carrier 35 and plural pins 44 are bent through one lateral wall and electrically connected to the circuit board 20. Alternatively, as shown in FIGS. 8A to 8C, the insulation carrier 35b includes four lateral walls 357a and 357b. The height of two opposite lateral walls 357a is larger than that of two opposite lateral walls 357b, and the height of the accommodating space 37 is identical with the height of the lateral walls 357a so as to construct the accommodating space 37. In the embodiment, the at least two power device 40 are completely accommodated in the accommodating space 37 of the insulation carrier 35b and plural pins 44 are bent through the shorter lateral wall 357b and electrically connected to the circuit board 20. Alternatively, as shown in FIGS. 4 to 6 and FIGS. 7A to 7D, the insulation carrier 35a includes four lateral walls 357 and four longitudinal walls 358. The four lateral walls 357 are connected between any adjacent two of the four longitudinal walls 358. The height of the four lateral walls 357 is less than a height of the four longitudinal walls 358, so as to construct the accommodating space 37. Furthermore, the accommodating groove 353 of the insulation carrier 35a divides the accommodating space 37 so as to accommodate the at least two power device 40 in two opposite sides of the accommodating groove 353. In the embodiment, the at least two power device 40 are completely accommodated in the accommodating space 37 of the insulation carrier 35a and plural pins 44 are bent through the lateral wall 357 and electrically connected to the circuit board 20. In addition, in the embodiment, the insulation carrier 35a is relative to two resilient pieces 31. The number of the resilient pieces 31 is more than 1. The insulation carrier 35a further includes at least one supporting wall 356 located between two of the first openings 352, disposed on the baseplate 351 of the insulation carrier 35a and extended from the baseplate 351 towards the heat-dissipation surface 11 of the housing 10 to separate the adjacent two power devices 40. It is emphasized that the types of the accommodating spaces 37 constructed by the insulation carrier 35, 35a or 35b is adjustable according to the practical requirements. As the embodiment shown in FIGS. 4 to 6 and FIGS. 7A to 7D, the insulation carrier 35 is further integrated with the accommodating groove 353 and the supporting wall 356 so as to construct one piece. The height of the accommodating space 37 is identical with the height H1 of the accommodating groove 252, the height H2 of the four corner walls 358 and the height H3 of the supporting wall 356, so as to enhance the supporting strength of the entire structure. In addition, as the embodiment shown in FIGS. 1 to 3, the insulation carrier 35 includes not only the accommodating space 37 but also at least two supporting ribs 38 disposed on the top surface of the insulation carrier 35 and nearby the opposite sides of the second through hole 36. Furthermore, the two supporting ribs 38 are disposed relative to the position where the two pushing fingers 33 of the resilient piece 31 contact with the insulation carrier 35, so as to support the circuit board 20 and maintain the gap between the insulation carrier 35 and the circuit board 20, while the limiting element 52 of the fastening unit 50 drives the base section 32 to move towards the circuit board 20 and the two pushing fingers 33 contact and push against the insulation carrier 35. However, it is not an essential feature to limit the present disclosure, and the related applications are not redundantly described herein.

Moreover, in an embodiment, the resilient set 30a provided at the step S3 of FIG. 9 further includes a plate 60. The plate 60 is disposed between the insulation carrier 30a and the circuit board 20. The plate 60 includes at least one second opening 61. The fastening unit 50 is connected to the base section 32 of the resilient piece 31 through the first through hole 21 of the circuit board 20 and the second opening 61 of the plate 60. The two pushing fingers 33 of the resilient piece 31 are partially contacted with the plate 60 respectively, as shown in FIGS. 4 to 6. While the fastening unit 50 drives the base section 32 of the resilient piece 31 to move towards the circuit board 20, the base section 32 drives each pushing finger 33 to push against the first side 41 of the corresponding power device 40. Consequently, the second side 42 of each of the two power devices 40 is attached to the heat-dissipation surface 11 and the two power devices 40 are clamped on the housing 10. In the embodiment, the resilient set 30a is constructed by the resilient piece 31, the insulation carrier 35a and the plate 60. Except of receiving the resilient piece 31 in the corresponding first opening 352 of the insulation carrier 35a, the insulation carrier 35a further includes at least positioning pin 355 relative to at least one positioning hole 64 of the plate 60 and at least one positioning hole 25 of the circuit board 20. Consequently, it facilitates the insulation carrier 35a, the plate 60 and the circuit board 20 to be positioned and assembled. On the other hand, the plate 60 further includes at least two stopping parts 62 disposed nearby two opposite edges of the second opening 61 and extended towards the heat-dissipation surface 11 of the housing 10 to limit a deformation of the resilient piece 31. While the fastening unit 50 drives the base section 32 to move towards the circuit board 20, the two stopping parts 62 touch the base section 32 to limit the deformation of the two pushing fingers 33 of the resilient piece 31 and prevent the resilient piece 31 from deforming to a flat. Consequently, it facilitates that the two power devices 40 are clamped on the housing 10 firmly. However, it is not an essential feature to limit the present disclosure, and the related applications are not redundantly described herein.

It is noted that the resilient piece 31 of the resilient set 30 or 30a includes the two pushing fingers 33 connected to each other through the base section 32 and constructed to form an M-word shape or a bird-wings shape. While the limiting element 52 of the fastening unit 50 drives the base section 32 to move towards the circuit board 20, the at least two through-hole power devices 40 disposed horizontally are driven to push against the heat-dissipation surface 11 of the housing 10. Consequently, the disposing and fastening procedures are simplified and thus the purposes of saving the labor, reducing the production cost and improving the reliability of the assembly structure are achieved. Moreover, the entire size of the power module assembly 1 or 1a is reduced, the heat-dissipating capacity of the power device is enhanced, and the purpose of enhancing the overall power density is achieved simultaneously. Certainly, the number of the power device relative to each resilient set 30 or 30a is adjustable according to the practical requirements. It is emphasized that he two pushing fingers 33 of the resilient piece 31 of the resilient set 30 or 30a are connected to each other through the base section 32 and constructed to form an M-word shape or a bird-wings shape. Consequently, while the base section 32 is driven to move towards the circuit board 20, the resiliency of the resilient piece 31 is maintained to push against the two power devices 40. The number of the power devices 40 pushed by each pushing finger 33 is adjustable according to the practical. For example, two pushing fingers 33 are employed to push against two corresponding power devices 40. Consequently, the configuration of the power devices inserted on the circuit board 20 is more variable. Certainly, the number of the power devices 40 relative to each resilient piece 31 in the resilient set 30 or 30a is not an essential feature to limit the present disclosure. The related applications are not redundantly described herein. It is further emphasized that the numbers and the positions of the power devices 40, the resilient set 30 and 30a, the heat-dissipation surface 11, the fastening unit 50 and the connection set 70 of the power module assembly 1 and 1a are adjustable according to the practical requirements. The present disclosure is not limited to the foregoing embodiments, and are not redundantly described herein.

In summary, the present disclosure provides a power module assembly and an assembling method thereof. By employing the resilient set disposed between the circuit board and the housing to push against the power devices and to optimize the assembling structure of the power devices, the power devices are fastened easily and firmly, the heat-dissipating capacity of the power devices is enhanced simultaneously, and the entire power density of the power module assembly is enhanced. Moreover, by employing a resilient set having a resilient piece in shape of symmetrical bird wings and disposed between the circuit board and the housing, at least two plug-in power devices disposed horizontally are pushed toward the heat-dissipation surface of the housing simultaneously. Consequently, the disposing and fastening procedures are simplified and thus the purposes of saving the labor, reducing the production cost and improving the reliability of the assembly structure are achieved. Moreover, the entire size of the power module assembly is reduced, the heat-dissipating capacity of the power device is enhanced, and the purpose of enhancing the overall power density is achieved simultaneously.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module assembly comprising:
 a housing including at least one heat-dissipation surface;
 a circuit board configured to mount on the housing, wherein the circuit board comprises at least one first through hole;
 at least one resilient set disposed between the housing and the circuit board, wherein the resilient set comprises at least one resilient piece and each resilient piece comprises a base section and two pushing fingers, wherein the two pushing fingers are outwardly extended from two opposite edges of the base section respectively;

at least two power devices electrically connected to the circuit board and located between the resilient set and the heat-dissipation surface of the housing, wherein the two power devices are opposite to the two pushing fingers of the resilient piece respectively; and at least one fastening unit disposed between the two power devices, connected to the base section of the resilient piece through the first through hole, wherein when the fastening unit is actuated to drive the base section of the resilient piece to move toward the circuit board, the two pushing fingers of the resilient piece push against the two power devices respectively and the two power devices are attached to the heat-dissipation surface.

2. The power module assembly according to claim 1, wherein the resilient set further comprises an insulation carrier, wherein the insulation carrier comprises an accommodating space, the resilient piece is pre-disposed in the accommodating space of the insulation carrier, and the two pushing fingers are partially contacted with the insulation carrier respectively, wherein the insulation carrier comprises at least one second through hole and the fastening unit is connected to the base section through the first through hole and the second through hole, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

3. The power module assembly according to claim 2, wherein the fastening unit comprises a fastening part and a limiting element, and the base section comprises a third through hole, and the housing comprises at least one first recess, wherein the limiting element is received in the first recess, and the fastening part is inserted into the limiting element through the first through hole, the second through hole and the third through hole, so that the fastening unit is connected with the base section and drives the base section to move towards the circuit board, wherein while the fastening part is locked into the limiting element, the limiting element is moved towards the circuit board.

4. The power module assembly according to claim 3, wherein the fastening part and the limiting element are a bolt and a nut respectively.

5. The power module assembly according to claim 3, wherein the limiting element is embedded in the first recess through an insulation sleeve, wherein the insulation sleeve is a hexagonal plastic sleeve.

6. The power module assembly according to claim 1, wherein the resilient set further comprises an insulation carrier, wherein the insulation carrier comprises an accommodating space and a baseplate, wherein the accommodating space is constructed below the baseplate, the baseplate comprises at least one first opening, the insulation carrier further comprises at least one accommodating groove, and the accommodating groove is disposed between two opposite edges of the first opening and divides the first opening into two partial openings, wherein the accommodating groove includes a groove opening facing the first opening, the two pushing fingers of the resilient piece are suspended in the corresponding two partial openings of the first opening respectively, the base section of the resilient piece is received in the accommodating groove, and the fastening unit is connected to the base section through the first through hole, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

7. The power module assembly according to claim 6, wherein the fastening unit comprises a fastening part and a limiting element, and the base section comprises a third through hole, and the accommodating groove is located between the two power devices and the accommodating groove further comprises at least one second recess, wherein the limiting element is embedded in the second recess of the accommodating groove, and the fastening part is inserted into the limiting element through the first through hole and the third through hole, so that the fastening unit is connected with the base section and drives the base section to move towards the circuit board, wherein while the fastening part is locked into the limiting element, the limiting element is moved towards the circuit board.

8. The power module assembly according to claim 7, wherein the fastening part and the limiting element are a bolt and a nut respectively.

9. The power module assembly according to claim 8, wherein the limiting element is embedded in the second recess through an insulation sleeve, wherein the insulation sleeve is a hexagonal plastic sleeve.

10. The power module assembly according to claim 6, wherein the resilient set further comprises a plate and the plate is disposed between the insulation carrier and the circuit board, wherein the plate comprises at least one second opening, the fastening unit is connected to the base section through the first through hole and the second opening, and the two pushing fingers of the resilient piece are partially contacted with the plate respectively, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing.

11. The power module assembly according to claim 10, wherein the plate further comprises at least two stopping parts disposed two opposite edges of the second opening and extended towards the heat-dissipation surface to limit a deformation of the resilient piece, wherein while the two power devices are clamped on the housing, the two stopping parts touch the base section.

12. The power module assembly according to claim 6, wherein a width of the accommodating groove is identical with a width of the accommodating space or a width of the accommodating groove is less than a width of the accommodating space.

13. The power module assembly according to claim 6, wherein the insulation carrier comprises four lateral walls, the accommodating space is formed by the baseplate and the lateral walls, wherein a height of the four lateral walls are the same, or a height of two opposite lateral walls are higher than a height of the other lateral walls and a height of the accommodating groove is identical with the height of the higher two opposite lateral walls.

14. The power module assembly according to claim 6, wherein the insulation carrier comprises four lateral walls and four longitudinal walls and the four lateral walls are connected between any adjacent two of the four longitudinal walls, wherein a height of the four lateral walls is less than a height of the four longitudinal walls and a height of the accommodating groove is identical with the height of the four longitudinal walls.

15. The power module assembly according to claim 6, wherein while the resilient set comprises more than one resilient piece, and the baseplate comprises more than one first opening, the insulation carrier further comprises at least one supporting wall located between two of the first openings, disposed on the baseplate of the insulation carrier and extended from the baseplate towards the heat-dissipation surface to separate the adjacent two power devices, wherein the supporting wall and the baseplate of the insulation carrier are integrally formed.

16. The power module assembly according to claim 1, wherein the two pushing fingers are connected to each other through the base section and constructed to form an M-word shape or a bird-wings shape.

17. The power module assembly according to claim 1, further comprising at least two connection sets disposed between the housing and the circuit board, and located nearby two opposite edges of the heat-dissipation surface to mount the circuit board on the housing; wherein each connection set comprises a supporting column, a mounting part, a first connection part and a second connection part, the first connection part and the second connection part are disposed on two ends of the supporting column respectively, wherein the circuit board comprises a first mounting hole and the mounting part is inserted and locked into the first connection part through the first mounting hole, wherein the housing comprises a second mounting hole, and the second connection part is inserted and locked into the second mounting hole to mount the circuit board on the housing.

18. The power module assembly according to claim 17, wherein the supporting column is an insulator, wherein the first connection part is a nut and the mounting part is a bolt inserted and locked into the supporting column through the first mounting hole, wherein the second connection part is a bolt embedded in the supporting column and inserted and locked into the second mounting hole.

19. The power module assembly according to claim 1, wherein each of the two power devices comprises a main body and plural pins, wherein the plural pins are inserted on the circuit board and electrically connected with the circuit board, and the main body disposed between the resilient set and the heat-dissipation surface of the housing.

20. An assembling method of a power module, comprising steps of:
(a) providing a housing including at least one heat-dissipation surface;
(b) providing a circuit board and at least two power devices, wherein the circuit board comprises at least one first through hole;
(c) providing a resilient set disposed between the housing and the circuit board, wherein the resilient set comprises at least one resilient piece and each resilient piece comprises a base section and two pushing fingers, wherein the two pushing fingers are outwardly extended from two opposite edges of the base section respectively, wherein the two power devices are located between the resilient set and the heat-dissipation surface of the housing and opposite to the two pushing fingers of the resilient piece, respectively;
(d) providing at least one fastening unit disposed between the two power devices, wherein the fastening unit is connected to the base section of the resilient piece through the first through hole, wherein when the fastening unit is actuated to drive the base section of the resilient piece to move toward the circuit board, the two pushing fingers of the resilient piece push against the two power devices respectively and the two power devices are attached to the heat-dissipation surface; and
(e) electrically connecting the at least two power devices to the circuit board.

21. The assembling method of the power module according to claim 20, wherein the resilient set further comprises an insulation carrier, wherein the insulation carrier comprises an accommodating space, the resilient piece is predisposed in the accommodating space of the insulation carrier, and the two pushing fingers are partially contacted with the insulation carrier respectively, wherein the insulation carrier comprises at least one second through hole and the fastening unit is connected to the base section through the first through hole and the second through, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

22. The assembling method of the power module according to claim 21, wherein the fastening unit comprises a fastening part and a limiting element, and the base section comprises a third through hole, and the housing comprises at least one first recess, wherein the limiting element is received in the first recess, and the fastening part is inserted into the limiting element through the first through hole, the second through hole and the third through hole, so that the fastening unit is connected with the base section and drives the base section to move towards the circuit board, wherein while the fastening part is locked into the limiting element, the limiting element is moved towards the circuit board.

23. The assembling method of the power module according to claim 22, wherein the fastening part and the limiting element are a bolt and a nut respectively.

24. The assembling method of the power module according to claim 20, wherein the resilient set further comprises an insulation carrier, wherein the insulation carrier comprises an accommodating space and a baseplate, wherein the accommodating space is constructed below the baseplate, the baseplate comprises at least one first opening, the insulation carrier further comprises at least one accommodating groove, and the accommodating groove is disposed between two opposite edges of the first opening and divides the first opening into two partial openings, wherein the accommodating groove includes an groove opening facing the first opening, the two pushing fingers of the resilient piece are suspended in the corresponding two partial openings of the first opening respectively, the base section of the resilient piece is received in the accommodating groove, and the fastening unit is connected to the base section through the first through hole, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing, wherein the two power devices are accommodated in the accommodating space.

25. The assembling method of the power module according to claim 24, wherein the fastening unit comprises a fastening part and a limiting element, and the base section comprises a third through hole, and the accommodating groove is located between the two power devices and the accommodating groove further comprises at least one second recess, wherein the limiting element is embedded in the second recess of the accommodating groove, and the fastening part is inserted into the limiting element through the first through hole and the third through hole, so that the fastening unit is connected with the base section and drives the base section to move towards the circuit board, wherein while the fastening part is locked into the limiting element, the limiting element is moved towards the circuit board.

26. The assembling method of the power module according to claim 25, wherein the fastening part and the limiting element are a bolt and a nut respectively.

27. The assembling method of the power module according to claim 24, wherein the resilient set further comprise a plate and the plate is disposed between the insulation carrier and the circuit board, wherein the plate comprises at least one second opening, the fastening unit is connected to the base section through the first through hole and the second opening, and the two pushing fingers of the resilient piece are partially contacted with the plate respectively, wherein while the fastening unit drives the base section to move towards the circuit board, the base section drives each pushing finger to push against a first side of the corresponding power device, so that a second side of each of the two power devices is attached to the heat-dissipation surface and the two power devices are clamped on the housing.

28. The assembling method of the power module according to claim 27, wherein the plate further comprises at least two stopping parts disposed two opposite edges of the second opening and extended towards the heat-dissipation surface to limit a deformation of the resilient piece, wherein while the two power devices are clamped on the housing, the two stopping parts touch the base section.

29. The assembling method of the power module according to claim 24, wherein a width of the accommodating groove is identical with a width of the accommodating space or a width of the accommodating groove is less than a width of the accommodating space.

30. The assembling method of the power module according to claim 20, wherein the two pushing fingers are connected to each other through the base section and constructed to form an M-word shape or a bird-wings shape.

31. The assembling method of the power module according to claim 20, further comprising a step of (e0) providing two connection sets disposed between the housing and the circuit board and located nearby two opposite edges of the heat-dissipation surface to mount the circuit board on the housing; wherein each connection set comprises a supporting column, a mounting part, a first connection part and a second connection part, the first connection part and the second connection part are disposed on two ends of the supporting column respectively, wherein the circuit board comprises a first mounting hole and the mounting part is engaged with the first connection part through the first mounting hole, wherein the housing comprises a second mounting hole, and the second connection part is inserted and locked into the second mounting hole to mount the circuit board on the housing.

32. The assembling method of the power module according to claim 20, wherein each of the two power devices comprises a main body and plural pins, wherein the plural pins are inserted on the circuit board and electrically connected with the circuit board, and the main body disposed between the resilient piece and the heat-dissipation surface of the housing.

* * * * *